United States Patent
Zhang et al.

(10) Patent No.: US 9,979,292 B2
(45) Date of Patent: May 22, 2018

(54) CONTROL METHOD AND CONTROL CIRCUIT FOR SWITCH IN SWITCHING POWER SUPPLY

(71) Applicant: Silergy Semiconductor Technology (Hangzhou) LTD, Hangzhou, ZheJiang Province (CN)

(72) Inventors: Shaobin Zhang, Hangzhou (CN); Le Li, Hangzhou (CN); Zhiliang Hu, Hangzhou (CN); Yongjiang Bai, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days. days.

(21) Appl. No.: 15/349,696

(22) Filed: Nov. 11, 2016

(65) Prior Publication Data
US 2017/0155322 A1   Jun. 1, 2017

(30) Foreign Application Priority Data
Nov. 27, 2015   (CN) .......................... 2015 1 0853909

(51) Int. Cl.
  *H02M 3/158*   (2006.01)
  *H02M 1/44*    (2007.01)
  *H02M 1/36*    (2007.01)

(52) U.S. Cl.
  CPC ............. *H02M 3/158* (2013.01); *H02M 1/36* (2013.01); *H02M 1/44* (2013.01)

(58) Field of Classification Search
  None
  See application file for complete search history.

(56) References Cited

U.S. PATENT DOCUMENTS

| | | | |
|---|---|---|---|
| 6,218,787 B1 | 4/2001 | Murcko et al. | |
| 8,416,587 B2 | 4/2013 | Chen | |
| 8,917,528 B2 | 12/2014 | Xu | |
| 9,131,582 B2 | 9/2015 | Chen | |
| 9,198,245 B2 | 11/2015 | Deng et al. | |
| 2011/0182089 A1* | 7/2011 | genannt Berghegger | H02M 3/33507 363/21.13 |
| 2013/0250629 A1 | 9/2013 | Xu | |
| 2014/0015501 A1* | 1/2014 | Youn | H03K 19/01750 323/272 |
| 2014/0211519 A1 | 7/2014 | Hsu et al. | |
| 2015/0162844 A1* | 6/2015 | Huang | H02M 1/36 257/741 |

* cited by examiner

*Primary Examiner* — Henry Lee, III
(74) *Attorney, Agent, or Firm* — Michael C. Stephens, Jr.

(57) ABSTRACT

A control circuit for driving a power switch in a switching power supply can include: a start-up transistor having a drain coupled to a drain of the power switch, and a source coupled to a drain voltage detecting circuit; a gate voltage detecting circuit configured to detect a gate voltage of the power switch, to compare the gate voltage against a first threshold voltage, and to change an on drive current and an off drive current in response thereto; and the drain voltage detecting circuit being configured to detect a drain voltage of the power switch, to compare the drain voltage against a second threshold voltage, and to change the on drive current and the off drive current in response thereto.

12 Claims, 4 Drawing Sheets

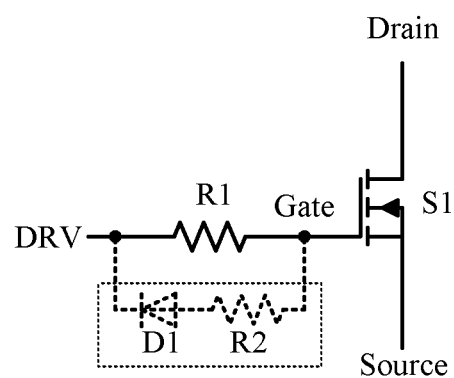
FIG. 1 (conventional)

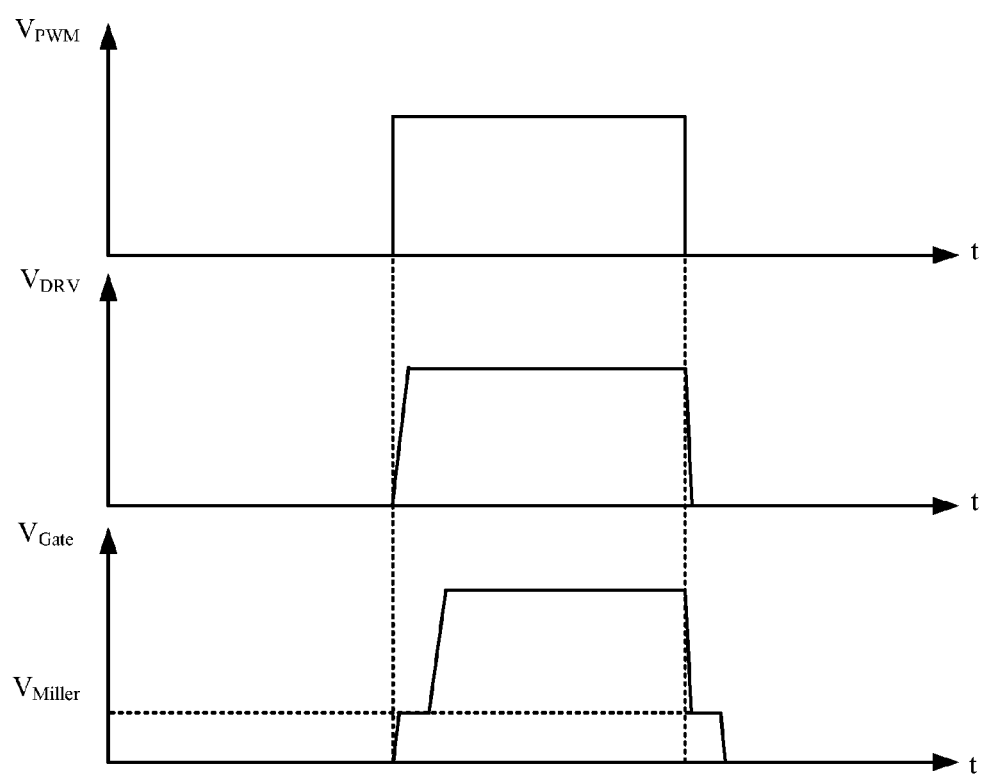
FIG. 2 (conventional)

CONTROL METHOD AND CONTROL CIRCUIT FOR SWITCH IN SWITCHING POWER SUPPLY

RELATED APPLICATIONS

This application claims the benefit of Chinese Patent Application No. 201510853909.6, filed on Nov. 27, 2015, which is incorporated herein by reference in its entirety.

FIELD OF THE INVENTION

The present invention generally relates to the field of power electronics, and more particularly to control methods and circuits for a switch in a switching power supply.

BACKGROUND

Driving the gate of a main power switch in a switching power supply may have a great impact on power performance. Serious electromagnetic interference (EMI) may result in because of relatively large di/dt and dv/dt of the main power switch if the driving capacity is too strong, (e.g., the driving current is too large). Also, switching losses may increase because of slow switching speeds due to relatively large switching delays of the main power switch if the driving capacity is too weak (e.g., the driving current is too small).

BRIEF DESCRIPTION OF THE DRAWINGS

FIG. 1 is a schematic block diagram of an example driving control circuit for a switch.

FIG. 2 is a waveform diagram of example operation of the circuit of FIG. 1.

DETAILED DESCRIPTION

Figure 3:
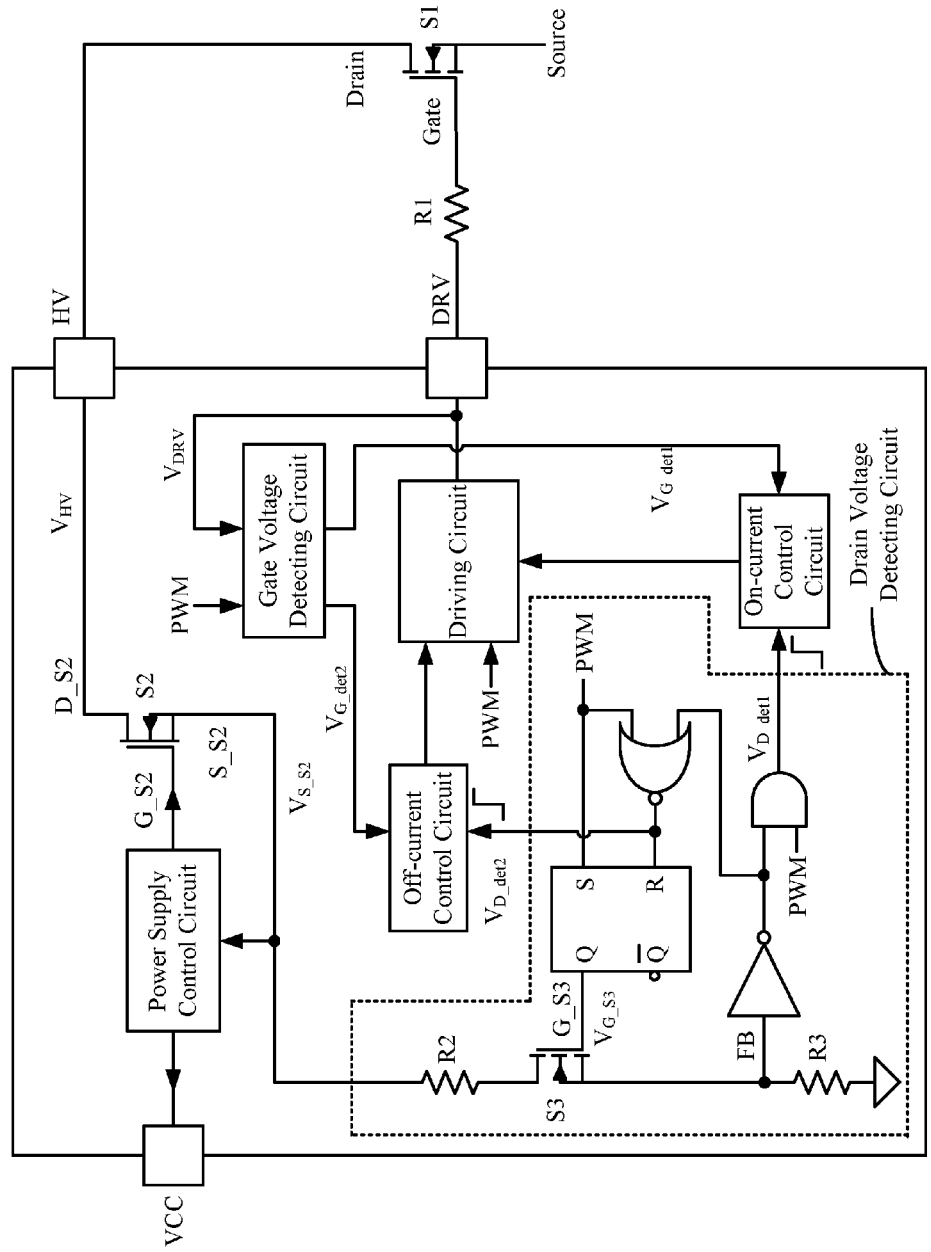
FIG. 3 is a schematic block diagram of an example control circuit for driving a switch in a switching power supply, in accordance with embodiments of the present invention.

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Referring now to FIG. 1, shown is a schematic block diagram of an example driving control circuit for a switch. The way of driving the gate of the main power switch can be optimized in order to reduce the electromagnetic interference (EMI) and switching losses. In this example, gate driving resistor R1 can be adjusted to regulate the ability of driving the gate on and off, or the gate driving resistor R1 may be used to regulate the ability of driving the gate on and another gate driving resistor R2 can be used to regulate the ability of driving the gate off.

Referring now to FIG. 2, shown is a waveform diagram of example operation of the circuit of FIG. 1. In this example, $V_{PWM}$ is a pulse-width modulation (PWM) control signal of a controller, $V_{DRV}$ is a driving signal generated by a driving circuit, $V_{Gate}$ is a gate driving signal obtained via a driving resistor, and $V_{Miller}$ is a Miller plateau voltage of the switch. The "Miller plateau" refers to a flat, horizontal portion in the gate charge characteristic of a MOS transistor. When the device switches, the gate voltage can be clamped to the plateau voltage until sufficient charge has been added or removed for the device to switch. As such, the Miller plateau can be utilized in estimating driving requirements and calculating the gate drive resistor for a given switching time.

The EMI performance can be relatively good while power losses of switch S1 may be relatively large when both resistors R1 and R2 are relatively large. However, power losses of switch S1 can be relatively small while the EMI performance may be relatively poor when both resistors R1 and R2 are relatively small. Therefore, this approach can be a compromise or trade-off between EMI interference and switching losses.

In particular embodiments, a control method of sectional driving of the gate of a switch is provided. However, since the sectional drive may be based on the detection and comparison of a Miller plateau voltage of the switch, and it can be difficult to detect the Miller plateau voltage, the voltage difference between Miller plateau voltages of different switches may be very different. Therefore, the approximate value of the Miller plateau voltage can be set in advance, and the sectional drive can be carried out based on the approximate value. If the set value is lower than the actual Miller plateau voltage, a relatively large di/dt can occur, which may lead to relatively poor EMI performance. If the set value is higher than the actual Miller plateau voltage, the driving current into the gate can become smaller, which may result in slower switching speeds and larger switching losses.

In one embodiment, a control circuit for driving a power switch in a switching power supply, can include: (i) a start-up transistor having a drain coupled to a drain of the power switch, and a source coupled to a drain voltage detecting circuit; (ii) a gate voltage detecting circuit configured to detect a gate voltage of the power switch, to compare the gate voltage against a first threshold voltage, and to change an on drive current and an off drive current in response thereto; and (iii) the drain voltage detecting circuit being configured to detect a drain voltage of the power switch, to compare the drain voltage against a second threshold voltage, and to change the on drive current and the off drive current in response thereto.

Referring now to FIG. 3, shown is a schematic block diagram of an example control circuit for driving a switch in a switching power supply, in accordance with embodiments of the present invention. In this particular example, the switching power supply may include power switch S1, and the control circuit for driving power switch S1 may be coupled between a gate "Gate" and a drain "Drain" of power switch S1. The control circuit can include start-up transistor S2, a gate voltage detecting circuit, a drain voltage detecting circuit, an on-current control circuit, an off-current control circuit, and a driving circuit.

The start-up transistor S2 may have drain D_S2 coupled to the drain of the power switch S1, source S_S2 coupled to a drain voltage detecting circuit, and gate G_S2 coupled to a power supply control circuit. For example, start-up transistor S2 can be an N-channel depletion-mode transistor for starting up the control circuit under a high voltage, and an on voltage threshold value $V_{TH}$ may be a negative value. When the control circuit is started, start-up transistor S2 can be turned on to supply power for the control circuit.

When the start-up phase completes, gate G_S2 of start-up transistor S2 may be set to a low level, and source voltage $V_{S\_S2}$ of start-up transistor S2 can be clamped to $-V_{TH}$ when drain voltage $V_{HV}$ of start-up transistor S2 is larger (e.g., in absolute value) than $-V_{TH}$. Source voltage $V_{S\_S2}$ can be equal to drain voltage $V_{HV}$ when drain voltage $V_{HV}$ is smaller (e.g., in absolute value) than $-V_{TH}$. This may be determined by the self-characteristic of start-up transistor S2, because the drains of start-up transistor S2 and power switch S1 are coupled together, so the drain voltage of power switch S1 can be also $V_{HV}$. It should be noted that the term "equal" as used herein may allow for a certain error and is not limited to completely and exactly being equal.

The drain voltage detecting circuit can indirectly detect the drain voltage of S2, that is, the drain voltage of S1. Thus, the drain voltage detecting circuit can optimize the sectional drive of S1 according to the relationship of di/dt, dv/dt, and the EMI performance. The gate voltage detecting circuit can detect gate voltage $V_{DRV}$ (e.g., the driving voltage of S1) of power transistor S1, and compare it against threshold voltage $V_{SD\_TH1}$ (the threshold voltage can be set to close to the on threshold voltage of power switch S1) in accordance with high-low level states of a PWM signal. The on-current control circuit and the off-current control circuit can be controlled according to the comparison result, in order to accordingly change the on-drive current and the off-drive current.

The drain voltage detecting circuit can detect the drain voltage of power switch S1 by detecting the source voltage of start-up transistor S2, and can compare it against threshold voltage $V_{SD\_TH2}$ in accordance with the high-low level states of the PWM signal. The on-current control circuit and the off-current control circuit can be controlled according to the comparison result, in order to accordingly change the on-drive current and the off-drive current. For example, the comparison between drain voltage of S1 and threshold voltage $V_{SD\_TH2}$ can be done by a comparator. However, in certain embodiments, the threshold voltage of an inverter itself can be used to determine the magnitude of the divided voltage signal, which may also realize the logic conversion of the inverter.

The on-current control circuit can receive gate detection signal $V_{G\_det1}$ output by the gate voltage detecting circuit, and drain detection signal $V_{D\_det1}$ output by the drain voltage detecting circuit, and may generate on-current control signal $I_{DRV\_ON}$. The off-current control circuit can receive gate detection signal $V_{G\_det2}$ output from the gate voltage detecting circuit, and drain detection signal $V_{D\_det2}$ output by the drain voltage detecting circuit, and may generate off-current control signal $I_{DRV\_OFF}$. The driving circuit can receive on-current control signal $I_{DRV\_ON}$ and off-current control signal $I_{DRV\_OFF}$, and may generate corresponding on-driving and off-driving currents to the gate of the power switch.

The drain voltage detecting circuit can include a voltage divider circuit that includes resistors R2 and R3 and receives source voltage S_S2 of the start-up transistor, and switch S3 can output divided voltage signal FB. Voltage divider signal FB may be compared against a threshold characterization voltage indicative of threshold voltage $V_{SD\_TH2}$, in order to detect the magnitude of the drain voltage to obtain drain detection signal $V_{D\_det1}$ and drain detection signal $V_{D\_det2}$.

Switch S3 can connect in series with the voltage divider circuit, and switch S3 can be turned on and off in accordance with the PWM signal and the drain detection signal. The drain voltage detecting circuit can also include an inverter with an input to receive divided voltage signal FB. Divided voltage signal FB may be compared against the voltage threshold value of the inverter itself (e.g., represents that source voltage S_S2 of the start-up transistor can be compared against threshold voltage $V_{SD\_TH2}$), to achieve a comparison of power transistor S1 and threshold voltage $V_{SD\_TH2}$, in order to output the drain detection signal at the output of the inverter.

The output of the inverter can connect with the first input of a NOR-gate, and the PWM signal may be input to the second input of the NOR-gate. The output of the NOR-gate can connect with reset terminal R of the RS flip-flop (e.g., the signal output from the output terminal of the NOR-gate can be used as drain detection signal $V_{D\_det2}$). The PWM signal may be also input to set terminal S of the RS flip-flop, and the output of the RS flip-flop can connect with the control terminal of switch S3. The output terminal of the inverter and the PWM signal may be respectively connected to the two input terminals of an AND-gate, and drain detection signal $V_{D\_det1}$ can be output by the AND-gate.

In one embodiment, a method of controlling a power switch in a switching power supply, can include: (i) using, in a turn-on phase when a gate voltage of the power switch is larger than a first threshold voltage, a small on drive current to reduce a current change rate of the power switch during a commutation stage in the switching power supply; (ii) detecting, in the turn-on phase, a drain voltage of the power switch, and adopting a large on drive current to accelerate a turn-on speed of the power switch when the drain voltage drops to a second threshold voltage; (iii) controlling, in a turn-off phase when an off drive current rises to a large off drive current or switches to a large off drive current, the gate voltage to rapidly decrease to speed up a turning-off speed; and (iv) detecting, in the turn-off phase when the drain voltage is larger than the second threshold voltage, the drain voltage of the power switch and adopting a small off drive current to reduce a current change rate and a drain voltage change rate of the power switch during the commutation stage.

Figure 4:
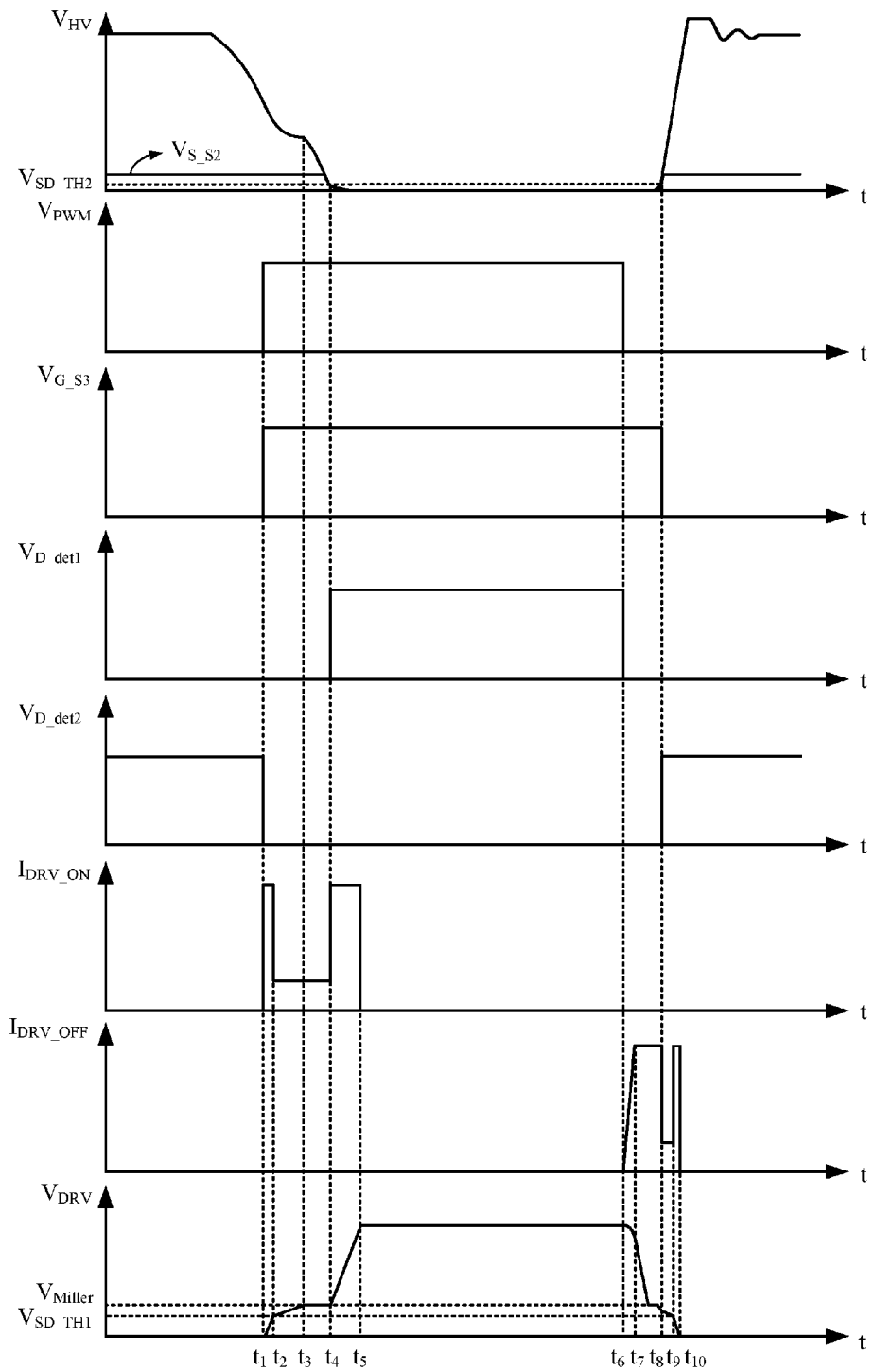
FIG. 4 is a waveform diagram of example operation of a control circuit for driving a switch in a switching power supply, in accordance with embodiments of the present invention.

Referring now to FIG. 4, shown is a waveform diagram of example operation of a control circuit for driving a switch in a switching power supply, in accordance with embodiments of the present invention. This diagram shows example waveforms of each signal, as well as the trend of the waveform at the corresponding time. The turn-on process of the power transistor S1 can be as follows. At time $t_1$, the PWM signal may go high, gate voltage $V_{G\_S3}$ of switch S3 can go high, and S3 may begin conducting. The gate voltage detecting circuit can detect the gate voltage (e.g., driving voltage $V_{DRV}$ of power transistor S1), and when driving voltage $V_{DRV}$ is smaller than threshold voltage $V_{SD\_TH1}$, the on-current control circuit can generate relatively large on-driving current $I_{DRV\_ON}$. This can result in driving voltage $V_{DRV}$ rapidly rising, so as to shorten the delay time before turning on the switch.

At time $t_2$, driving voltage $V_{DRV}$ can rise to reach a level of threshold voltage $V_{SD\_TH1}$, and after the gate voltage detecting circuit detects it, the on-current control circuit may generate relatively small drive current $I_{DRV\_ON}$ in order to reduce di/dt (e.g., the current change rate) of the power device during commutation, thereby improving the EMI performance of the power supply. A "commutation" mode or stage is whereby the power device transitions from an off-state to an on-state, or vice versa.

At time $t_3$, driving voltage $V_{DRV}$ can be equal to Miller plateau voltage $V_{Miller}$ of power transistor S1. In this process, without detecting Miller plateau voltage $V_{Miller}$, the drain voltage $V_{HV}$ of power transistor S1 can begin to decrease, and the smaller drive current $I_{DRV\_ON}$ may result in a reduced voltage change rate dv/dt of power transistor S1, thereby improving the EMI performance. When $V_{HV}$ falls below the on threshold voltage $-V_{TH}$ of depletion mode transistor S2, source voltage $V_{S\_S2}$ of S2 can begin to decrease.

At time $t_4$, source voltage $V_{S\_S2}$ of S2 (i.e., drain voltage $V_{HV}$ of S1, S2) can drop below threshold voltage $V_{SD\_TH2}$, so the voltage obtained by dividing $V_{S\_S2}$ via resistors R2, R3 may be smaller than the threshold value of the inverter. The output of the inverter can go high, and drain detection signal $V_{D\_det1}$ generated by the drain voltage detection circuit can go high. The on-current control circuit can detect a rising edge signal of $V_{D\_det1}$, and may generate a relatively large drive current, so as to reduce the influence of the Miller effect, to speed up the turning-on speed of power transistor S1, and to reduce the turning on losses. At time $t_5$, the turn-on process can be completed, and drive current $I_{DRV\_ON}$ may drop to zero.

The turn off process of S1 can be as follows. At time t6, the PWM signal can go low, and the off-current control circuit can control off drive current $I_{DRV\_OFF}$ to gradually increase from zero. Thus, drive voltage $V_{DRV}$ can gradually decrease (or an off drive current $I_{DRV\_OFF}$ with a constant small value may cause drive voltage $V_{DRV}$ to decrease gradually), in order to reduce di/dt during commutation, and to improve EMI performance.

At time $t_7$, off drive current $I_{DRV\_OFF}$ may rise to a large drive current (or switches from an initial small off drive current to the large off drive current at time $t_7$), and relatively large drive current $I_{DRV\_OFF}$ can control drive voltage $V_{DRV}$ to fall rapidly to accelerate the turn-off speed of power transistor S1, and to reduce the turn-off losses. When $V_{DRV}$ drops to the Miller plateau voltage $V_{Miller}$ of power transistor S1, drain voltage $V_{HV}$ of power transistor S1 can begin to rise, and source voltage $V_{S\_S2}$ of S2 can also begin to rise.

At time $t_8$, $V_{S\_S2}$ can rise above segment threshold value $V_{SD\_TH2}$. The voltage obtained by dividing source voltage $V_{S\_S2}$ of S2 via resistors R2 and R3 may be larger than the threshold value of the connected inverter, and the output of the inverter may go low. Drain detection signal $V_{D\_det2}$ generated by the drain voltage detecting circuit can go high, gate voltage $V_{G\_S3}$ of switch S3 can go low, and S3 can be turned off. At this time, the off current control circuit can detect the rising edge signal of drain detection signal $V_{D\_det2}$ to generate a smaller off drive current $I_{DRV\_OFF}$, such that $V_{DRV}$ may decrease to reduce di/dt of the power device during commutation, and dv/dt of the drain voltage of power switch S1, thereby improving the EMI performance. When $V_{HV}$ rises above the on threshold voltage $-V_{TH}$ of depletion mode transistor S2, source voltage $V_{S\_S2}$ of S2 may be clamped to $-V_{TH}$, where $-V_{TH}$ here can be a third threshold voltage.

At time $t_9$, when the gate voltage detecting circuit detects that drive voltage $V_{DRV}$ is smaller than segment threshold value $V_{SD\_TH1}$, the off current control circuit can again generate a relatively large off drive current $I_{DRV\_OFF}$, such that $V_{DRV}$ may rapidly decrease to reduce the falling delay time of $V_{DRV}$ after power transistor S1 is turned off. At time $t_{10}$, the shutdown process may be completed, and drive current $I_{DRV}$ OFF can be reduced to zero.

It should be noted that the terms "large" and "small" as used herein, such as with respect to "large on drive current," "large off drive current," "small on drive current," and "small off drive current" are relative descriptors, and are not limited to any specific amplitude.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A method of controlling a power switch in a switching power supply, the method comprising:
    a) using, in a turn-on phase when a gate voltage of said power switch is larger than a first threshold voltage, a small on drive current to reduce a current change rate of said power switch during a commutation stage in said switching power supply;
    b) detecting, in said turn-on phase, a drain voltage of said power switch, and adopting a large on drive current to accelerate a turn-on speed of said power switch when said drain voltage drops to a second threshold voltage;
    c) controlling, in a turn-off phase when an off drive current rises to a large off drive current or switches to a large off drive current, said gate voltage to rapidly decrease to speed up a turning-off speed; and
    d) detecting, in said turn-off phase when said drain voltage is larger than said second threshold voltage, said drain voltage of said power switch and adopting a small off drive current to reduce a current change rate and a drain voltage change rate of said power switch during said commutation stage.

2. The method of claim 1, wherein said turn-on phase further comprises, when said gate voltage is smaller than said first threshold voltage:
    a) detecting said gate voltage of said power switch in said switching power supply; and
    b) adopting a large on drive current to shorten a delay time before turning on said power switch.

3. The method of claim 1, wherein said turning-off phase further comprises said off drive current gradually rising from zero or said small off drive current being adopted to gradually reduce said gate voltage, so as to reduce said current change rate of said power switch during said commutation stage.

4. The method of claim 1, wherein said turning-off phase further comprises, when said gate voltage is detected to be smaller than said first threshold voltage, adopting said large off drive current to shorten a delay time before turning off said power switch.

5. The method of claim 2, wherein during said turning-on phase when said gate voltage rises to a Miller plateau voltage of said power switch, said small on drive current is adopted to reduce the drain voltage change rate of said power switch.

6. A control circuit for driving a power switch in a switching power supply, the control circuit comprising:
    a) a start-up transistor having a drain coupled to a drain of said power switch, and a source coupled to a drain voltage detecting circuit;
    b) a gate voltage detecting circuit configured to detect a gate voltage of said power switch, to compare said gate voltage against a first threshold voltage, and to change an on drive current and an off drive current in response thereto; and c) said drain voltage detecting circuit being configured to detect a drain voltage of said power switch, to compare said drain voltage against a second threshold voltage, and to change said on drive current and said off drive current in response thereto, wherein a gate of said start-up transistor is set to a low level after said start-up transistor is turned on, a source voltage of said start-up transistor is clamped to a third threshold voltage when a drain voltage of said start-up transistor is larger than said third threshold voltage, and said source voltage and said drain voltage are maintained as consistent with each other when said drain voltage of said start-up transistor is smaller than said third threshold voltage.

7. A control circuit for driving a power switch in a switching power supply, the control circuit comprising:

a) a start-up transistor having a drain coupled to a drain of said power switch, and a source coupled to a drain voltage detecting circuit;

b) a gate voltage detecting circuit configured to detect a gate voltage of said power switch, to compare said gate voltage against a first threshold voltage, and to change an on drive current and an off drive current in response thereto;

c) said drain voltage detecting circuit being configured to detect a drain voltage of said power switch, to compare said drain voltage against a second threshold voltage, and to change said on drive current and said off drive current in response thereto;

d) an on current control circuit configured to receive a first gate detection signal from said gate voltage detecting circuit and a first drain detection signal from said drain voltage detecting circuit, and to generate an on current control signal;

e) an off current control circuit configured to receive a second gate detection signal from said gate voltage detecting circuit and a second drain detection signal from said drain voltage detecting circuit, and to generate an off current control signal; and f) a driving circuit configured to receive said on current control signal and said off current control signal, and to generate an on drive current and an off drive current to said gate of said power switch in response thereto.

8. The control circuit of claim 6, wherein:

a) said start-up transistor comprises an N-channel depletion mode transistor having an on voltage threshold value of a negative value; and b) said third threshold voltage is equal to an absolute value of said on voltage threshold value of said N-channel depletion mode transistor.

9. The control circuit of claim 6, wherein said drain voltage detecting circuit comprises a voltage divider circuit configured to:

a) receive said source voltage of said start-up transistor;

b) generate a divided voltage signal for comparison against a threshold characterization voltage indicative of said second threshold voltage; and c) detect a magnitude of said drain voltage to obtain first and second drain detection signals.

10. The control circuit of claim 9, wherein said drain voltage detecting circuit further comprises a third switch coupled in series with said voltage divider circuit, and being controlled according to a pulse-width modulation (PWM) signal and a drain detection signal.

11. The control circuit of claim 10, wherein said drain voltage detecting circuit further comprises an inverter having an input terminal configured to receive said divided voltage signal for comparison against a voltage threshold value of said inverter, and to generate said drain detection signal at an output terminal of said inverter.

12. The control circuit of claim 11, wherein said voltage threshold value of said inverter is used to represent said second threshold voltage.

* * * * *